(12) United States Patent
Sundstrom

(10) Patent No.: US 8,416,613 B1
(45) Date of Patent: Apr. 9, 2013

(54) MAGNETORESISTIVE BRIDGE NONVOLATILE MEMORY DEVICE

(75) Inventor: Lance L. Sundstrom, North Pinellas Park, FL (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 119 days.

(21) Appl. No.: 13/064,939

(22) Filed: Apr. 27, 2011

(51) Int. Cl.
*G11C 11/00* (2006.01)

(52) U.S. Cl.
USPC .......................................... 365/158; 365/171

(58) Field of Classification Search .................. 365/158, 365/171
See application file for complete search history.

(56) References Cited

U.S. PATENT DOCUMENTS

| | | | |
|---|---|---|---|
| 6,429,640 B1 | 8/2002 | Davghton et al. | 324/117 R |
| 6,882,145 B2 | 4/2005 | Ehresmann et al. | 324/252 |
| 6,917,088 B2 * | 7/2005 | Takahashi et al. | 257/422 |
| 7,277,317 B2 * | 10/2007 | Le Phan | 365/158 |
| 7,508,200 B2 | 3/2009 | Kahlman | 324/225 |
| 7,724,566 B1 * | 5/2010 | Sundstrom | 365/158 |
| 8,168,468 B2 * | 5/2012 | Mathew et al. | 438/95 |
| 8,274,818 B2 * | 9/2012 | Ohno et al. | 365/158 |

\* cited by examiner

*Primary Examiner* — Pho M Luu
(74) *Attorney, Agent, or Firm* — John Tarlano

(57) ABSTRACT

A magnetoresistive bridge nonvolatile memory device having a flat, continuous folded closed magnetic loop, the magnetic loop having a side for holding four sense metal terminated magnetic shunts, and four planar central parallel rectangular giant magnetoresistive GMR resistors, each of the four central parallel rectangular giant magnetoresistive GMR resistors being located on the side of the continuous folded closed magnetic loop between each of two of the sense metal terminated magnetic shunts, each two of the four sense metal terminated magnetic shunts electrically connected to adjacent ends of a central parallel rectangular giant magnetoresistive GMR resistor.

2 Claims, 4 Drawing Sheets

MAGNETORESISTIVE BRIDGE NONVOLATILE MEMORY DEVICE

A magnetoresistive bridge nonvolatile memory device is disclosed. The magnetoresistive bridge nonvolatile memory device contains four magnetoresistive resistors that can be magnetically switched between nonvolatile low and high electrical resistance value states. The electrical resistance states of the four magnetoresistive resistors are switched simultaneously.

The magnetoresistive bridge nonvolatile memory device has a folded and closed continuous magnetic material loop. The magnetic loop is made from a magnetic field carrying material such as a ferromagnetic material.

The magnetoresistive bridge nonvolatile memory device has four central parallel giant magnetoresistive (GMR) resistors. The four central parallel giant magnetoresistive (GMR) resistors comprise the four parallel legs of the folded closed magnetic material loop. Each of the four giant magnetoresistive (GMR) resistors has two end electrodes. The two end electrodes of each giant magnetoresistive (GMR) resistor are comprised of portions of one or more metal layers. The electrical length of each GMR resistor is defined by the distance between its end electrode metal terminations. The electrical width of each GMR resistor is the width of the GMR leg. The four giant magnetoresistive (GMR) resistors comprise the metal terminated parallel legs of the closed folded magnetic loop.

A GMR resistor is planar and is terminated much like a thin or thick film resistor. Its electrical resistance is defined by its magnetically switchable nonvolatile sheet resistance times its electrical length divided by its electrical width.

A giant magnetoresistive (GMR) resistor comprises each of four parallel legs of a folded closed magnetic material loop. A portion of a metal layer, that is in electrical contact with each end of each giant magnetoresistive (GMR) resistor, comprises the GMR resistor electrodes. An electromagnetic coil is wrapped around (above and below) each of the four giant magnetoresistive (GMR) resistor portions of the folded closed magnetic loop. The trace portions of the electromagnetic coil above and below each GMR resistor leg are electrically isolated from that GMR resistor leg by intervening insulating layers, such as bit oxide (BITOX).

The magnetoresistive memory bridge device can be used to store one binary bit of information. Electrically adjacent connected giant magnetoresistive (GMR) resistor are magnetically switched to opposite resistive states. When a bias voltage or current is applied between the ends of the GMR resistor bridge, such as ends 22 and 24 of a GMR resistor shown in FIG. 1A, the two ends of the GMR resistor bridge develop a difference voltage that is defined by the stored binary value. When the GMR resistive states are switched, the difference voltage is reversed. The GMR resistor bridge is thereby self-referenced. One binary bit of information is nonvolatilely stored in the four GMR resistors of the magnetoresistive bridge nonvolatile memory device. The binary 0 or 1 bit state can be stored due to one or the other directional magnetic path directions taken by a magnetic field generated in the closed magnetic loop by the electromagnetic coil.

Center parallel rectangular sections, shown in FIG. 1, define four GMR resistors. Generally half-circle sections define magnetic shunts between GMR resistor ends to form a folded closed continuous magnetic material loop. The metal electrodes on top of the magnetic shunts define GMR resistor electrical lengths and electrically connect the GMR resistors in a closed loop resistor bridge configuration.

The magnetoresistive bridge nonvolatile memory device has an electromagnetic crisscross coil wrapped around the GMR resistor portions of the folded closed magnetic loop. The electromagnetic crisscross coil generates a magnetic field in a first or second direction in the continuous closed magnetic loop. Each of the four giant magnetoresistive (GMR) resistors of the magnetic loop of the magnetoresistive bridge nonvolatile memory device nonvolatilely stores one or the other of two different resistance states depending on the direction of the write magnetic field generated in the magnetic loop by the electromagnetic coil.

SUMMARY OF THE INVENTION

A magnetoresistive bridge nonvolatile memory device comprising a continuous folded closed magnetic loop having four sense metal terminated magnetic shunts, and four central parallel rectangular giant magnetoresistive GMR resistors, each of the four central parallel rectangular giant magnetoresistive GMR resistors being located on the continuous folded closed magnetic loop between each of two of the sense metal terminated magnetic shunts, each two of the four sense metal terminated magnetic shunts electrically connected to adjacent ends of a central parallel rectangular giant magnetoresistive GMR resistor.

DESCRIPTION OF THE PREFERRED EMBODIMENT

Figure 1:
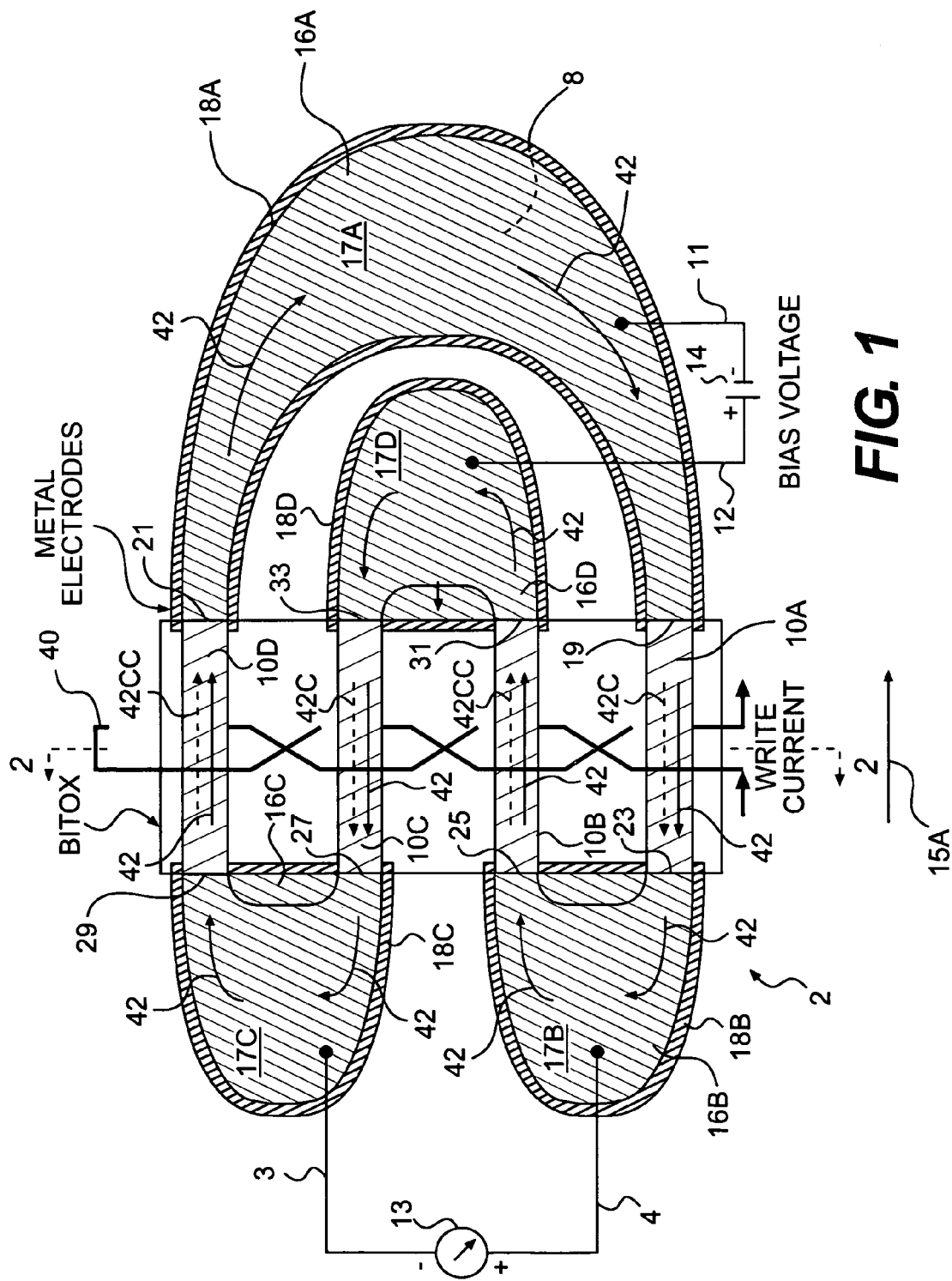
FIG. 1 is a plan/top view of a magnetoresitive bridge nonvolatile memory device having a folded closed magnetic loop comprised of four giant magnetoresistive resistors connected by four metal terminated magnetoresistive shunts, and having a first, clockwise, write magnetic field direction.
Figure 1A:
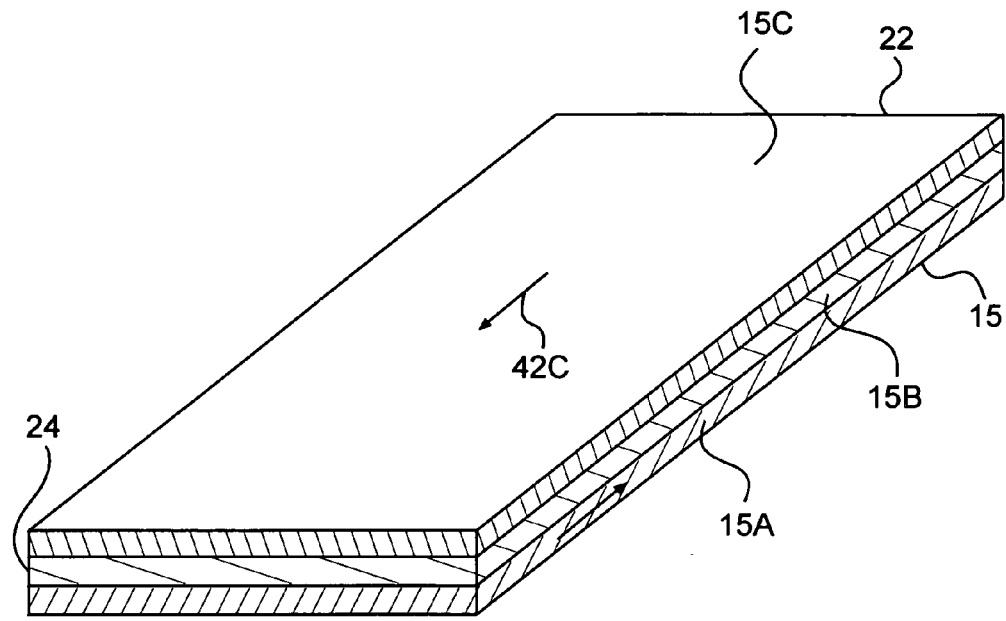
FIG. 1A is a perspective view of a giant magnetoresistive (GMR) resistor stack-up that has anti-parallel, oppositely, polarized ferromagnetic layers 15A & 15C separated by nonmagnetic layer 15B, the magnetic polarization direction of lower pinned layer 15A being anti-parallel to the magnetic polarization direction 42 of upper switched layer 15C.
Figure 1B:
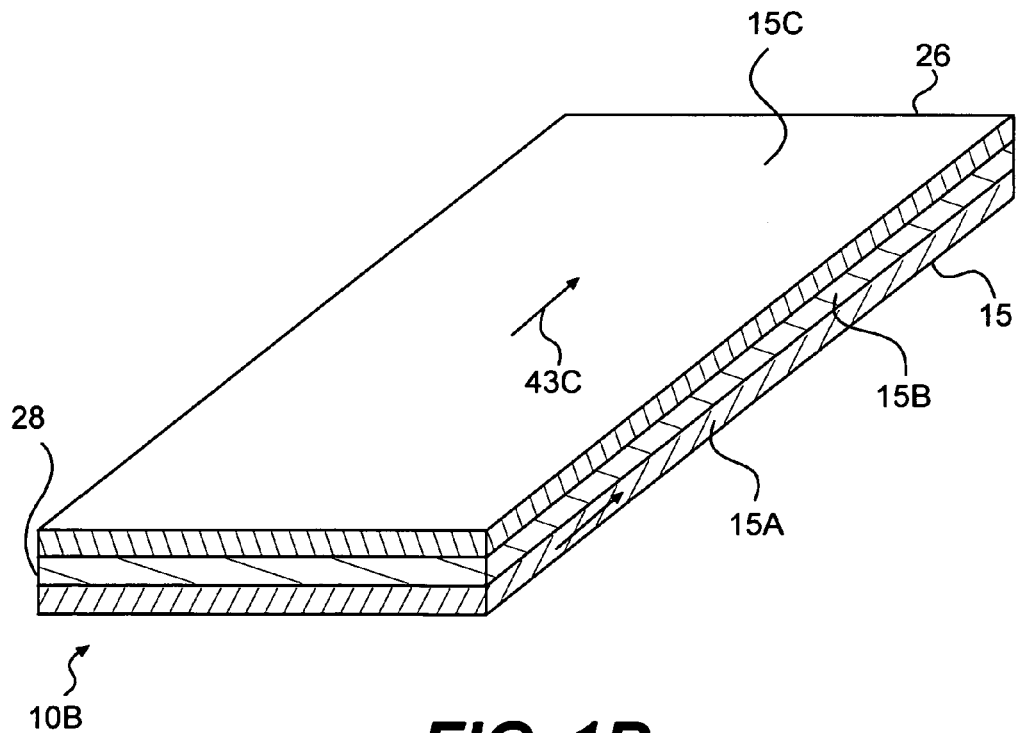
FIG. 1B is a perspective view of a giant magnetoresistive (GMR) resistor stack-up that has parallel polarized ferromagnetic layers, the magnetic polarization direction of lower pinned layer 15A being parallel to magnetic polarization direction 43.
Figure 1C:
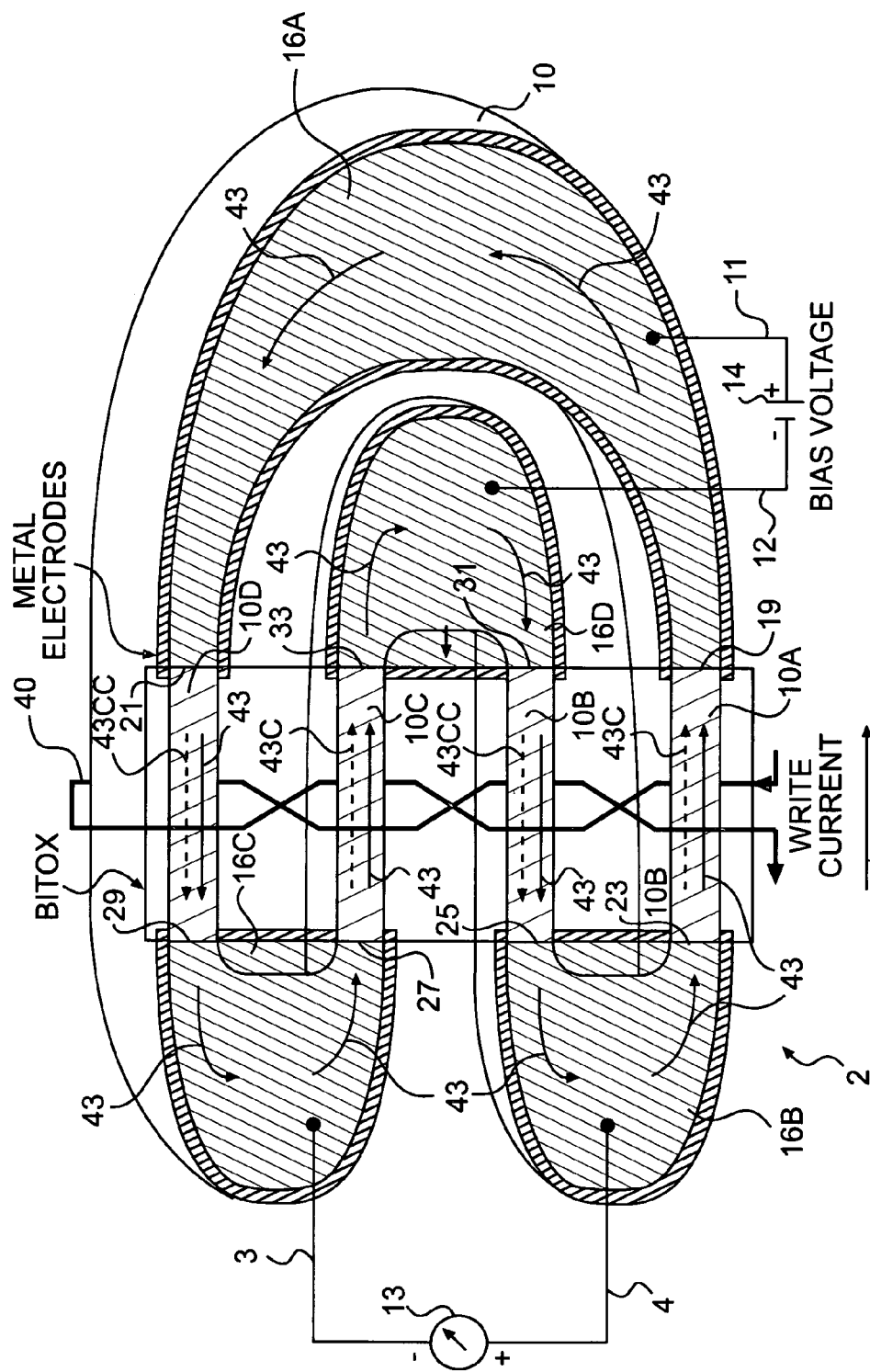
FIG. 1C is a plan/top view of the nonvolatile magnetoresistive memory bridge device of FIG. 1 having a second, counterclockwise, write magnetic field direction.

FIGS. 1 and 1C show a top/plan view of a magnetoresistive bridge nonvolatile memory device 2. The magnetoresistive bridge nonvolatile memory device 2 has a folded continuous closed magnetic material loop 10 as shown in FIG. 1C. Four giant magnetoresistive (GMR) resistors 10A, 10B, 10C and 10D and four electrodes 16A, 16B, 16C and 16D are located on and electrically insulated from a side 8 of loop 10 as shown in FIG. 1. There are four magnetic shunts 17A, 17B, 17C and 17D, each magnetic shunt being a separate magnetic material portion, that is, region, of magnetic material loop 10. The loop 10 and shunts 17A, 17B, 17C and 17D can convey a magnetic field around the loop 10.

The electrodes 16A, 16B 16C and 16D are located, respectively, over the magnetic shunts 17A, 17B, 17C and 17D. The shunts are thus metal terminated magnetic material shunts. The electrodes are electrically insulated from the magnetic shunts 17A, 17B, 17C and 17D, respectively, by insulator layers 18A, 18B, 18C and 18D.

The electrodes are electrically connected to the resistors by an electrical connection method such as by electrode material evaporation. Thus electrode 16A is electrically connected to right ends of resistors 10A and 10D at junctions 19 and 21 respectively. Electrode 16B is electrically connected to left ends of resistors 10A and 10B at junctions 23 and 25 respectively. Electrode 16C is electrically connected to left ends of resistors 10C and 10D at junctions 27 and 29 respectively. Electrode 16D is electrically connected to right ends of resistors 10B and 10C at junctions 31 and 33 respectively.

As shown in FIGS. 1 and 1C, the four giant magnetoresistive (GMR) resistors 10A, 10B, 10C and 10D are located on the four central parallel rectangular leg regions of loop 10. The four magnetic shunts 17A, 17B, 17C and 17D comprise the four generally half-circle regions of folded closed magnetic material loop 10.

The continuous closed magnetic material loop 10 can be made from ferromagnetic material or paramagnetic material. The giant magnetoresistive (GMR) resistors 10A, 10B, 10C and 10D are electrically energized by metal electrodes that overlaid magnetic shunts 17A, 17B, 17C and 17D. Metal electrodes 16A, 16B, 16C and 16D respectively overlay magnetic shunts 17A, 17B, 17C and 17D. Metal electrodes 16A, 16B, 16C and 16D electrically connect to giant magnetoresistive (GMR) resistors 10A, 10B, 10C and 10D in a closed loop. Magnetic shunts 17A, 17B, 17C and 17D, and the four intermediate magnetic loop materials between the four magnetic shunts, magnetically connect to giant magnetoresistive (GMR) resistors 10A, 10B, 10C and 10D in a closed loop.

The giant magnetoresistive (GMR) resistors 10A, 10B, 10C and 10D have patterned portions that were formed from three common GMR layers. Each GMR resistor is comprised of two ferromagnetic layers, such as nickel (Ni), iron (Fe), cobalt (Co) and/or alloys thereof, separated by a non-ferromagnetic layer, such as copper. A first common GMR ferroelectric layer was electrically insulated from the loop 10 by an insulator layer that had been formed on the loop 10 prior to deposition of the first common GMR ferroelectric layer on loop 10.

One of the ferromagnetic layers is pinned (prevented from magnetically switching) by the presence of an adjacent platinum (Pt), manganese (Mg) and/or alloys thereof. The global magnetization direction of the pinned layer is permanently set during the manufacturing process. The other ferromagnetic layer is free to be locally switched by the applied magnetic field of a magnetic coil.

A GMR resistor has a lower sheet resistance when its free layer and pinned layer have magnetization directions that are parallel, as depicted in FIG. 1B, than when its free and pinned layers have magnetization directions that are anti-parallel, as depicted in FIG. 1A. Only the free layers of GMR resistors 10A, 10B, 10C and 10D are switched by the applied magnetic field of the crisscrossed magnetic coil around them. Free layers of magnetic shunt regions 17A, 17B, 17C and 17D are not switched. FIGS. 1A and 1B depict a GMR layer portion 15 of a GMR resistor between its end metal electrode terminated magnetic shunt regions.

FIG. 1A depicts the high resistance magnetization state of GMR resistors 10A and 10C of FIGS. 1 and 10B and 10D of FIG. 1C, wherein, the magnetization direction 42 of free upper ferromagnetic layer 15C is anti-parallel to the global magnetization direction of pinned lower ferromagnetic layer 15A. Ends 22 and 24 of a GMR resistor of FIG. 1A are shown. Non-ferromagnetic layer 15B separates lower pinned ferromagnetic layer 15A from upper free ferromagnetic layer 15C. FIG. 1B depicts the low resistance magnetization state of GMR resistors 10B and 10D of FIGS. 1 and 10A and 10C of FIG. 1C, wherein, the magnetization direction 43 of free upper ferromagnetic layer 15C is parallel to the global magnetization direction of pinned lower ferromagnetic layer 15A. Ends 26 and 28 of a GMR resistor of FIG. 1B are shown.

In FIG. 1, leads or traces 11 and 12, connect the negative and positive terminals of bias voltage 14 to metal electrodes 16D and 16A and leads 3 and 4 connect the negative and positive terminals of voltmeter 13 to metal electrodes 16C and 16B, respectively. A sense amplifier may be used in place of voltmeter 13. Voltmeter 13 will read a positive voltage for the first, clockwise, closed loop magnetization direction of FIG. 1 and a negative voltage for the second, counterclockwise, closed loop magnetization direction of FIG. 1C.

A typical application would tie metal electrode 16A to ground, tie metal electrodes 16B and 16C to the positive and negative inputs, respectively, of a switched differential read sense amp, and tie metal electrode 16D to a switched bias voltage/current source device.

In FIG. 1, the magnetoresistive memory bridge device 2 has an electromagnetic crisscross write coil 40. The electromagnetic crisscross coil 40 is crisscross wrapped, that is, woven, directly around the four GMR resistor portions 10A to 10D of closed magnetic loop 10.

Figure 2:
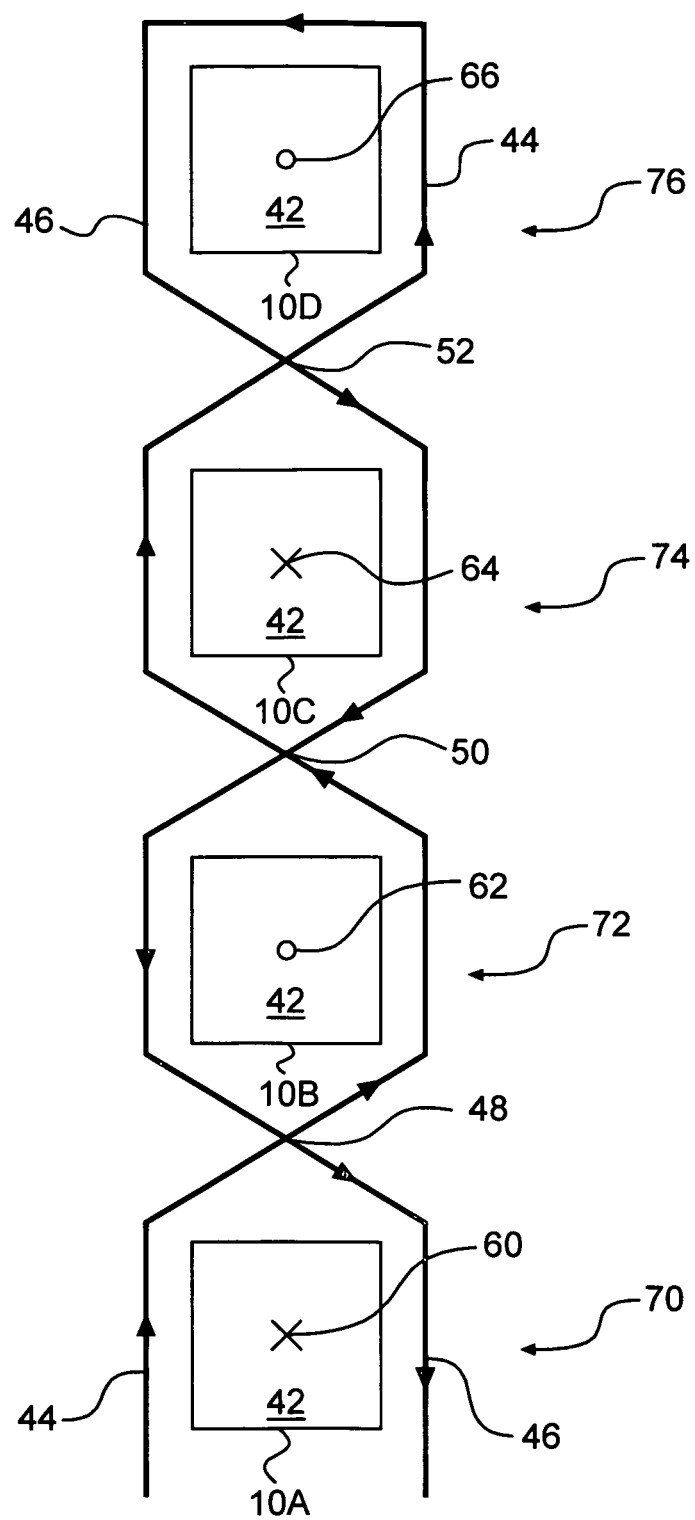
FIG. 2 is cross sectional view 2-2 of FIG. 1 showing a crisscross magnetic coil wound around the four giant magnetoresistive (GMR) resistors of the folded closed magnetic loop, electrically insulating layers being represented by gaps between the GMR resistors and the crisscross magnetic coil.

A write current is sent through the electromagnetic crisscross coil 40. As shown in FIG. 2, when a write current is sent through the electromagnetic crisscross coil 40 in a first write direction, the electromagnetic crisscross coil 40 generates a first, clockwise, loop magnetic fields 60, 62, 64 and 66 in loop 10. As shown in FIGS. 1 and 2, loop magnetic field 42 is sent through GMR resistors 10A to 10D, magnetic shunts 17A to 17D and loop 10.

FIG. 1A shows a downward pointing portion 42C of first, clockwise, loop magnetic field 42 that exists within GMR resistors 10A and 10C of FIG. 1. An upward pointing portion 42CC of first, clockwise, loop magnetic field 42 exists within GMR resistors 10B and 10D of FIG. 1.

FIG. 1B shows an upward pointing portion 43C of second, counterclockwise, loop magnetic field 43 that exists within GMR resistors 10A and 10C of FIG. 1C. A downward pointing portion 43CC of second, counterclockwise, loop magnetic field 43 exists within GMR resistors 10B and 10D of FIG. 1C.

FIG. 1C shows that when a write current is sent through the electromagnetic crisscross coil 40 in a second write direction, electromagnetic crisscross coil 40 generates a second, counterclockwise, loop magnetic field 43 through GMR resistors 10A to 10D and through magnetic shunts 17A to 17D.

As shown in FIGS. 1A and 1B, each of giant magnetoresistive GMR resistors 10A to 10D, respectively, has a pinned ferromagnetic layer 15A. Each of giant magnetoresistive GMR resistors 10A to 10D, respectively, has a freely magnetically switchable ferromagnetic layer 15C. Each of GMR resistors 10A to 10D has a non-ferromagnetic layer 15B separating ferromagnetic layers 15A and 15C. In FIGS. 1A and 1B, the ferroelectric polarization direction of pinned ferromagnetic layers 15A, of giant magnetoresistive GMR resistors 10A to 10D, is in an upward pointing direction.

When first, clockwise, loop magnetic field 42 courses through closed magnetic loop 10 as shown in FIG. 1, GMR resistors 10A and 10C are set to a high resistance state (Rmin+delta R) while GMR resistors 10B and 10D are set to a low resistance state (Rmin). This is because the magnetization polarization directions of their pinned and free ferromagnetic layers 15A and 15C, respectively, are anti-parallel in GMR resistors, 10A and 10C and parallel in GMR resistors 10B and 10D. The first, clockwise, magnetic field 42 in the closed magnetic loop is due to a current passing through crisscross coil 40 in a first write direction, as shown in FIG. 1.

When a second, counterclockwise, loop magnetic field 43 courses through the closed magnetic loop 10 as shown in FIG. 1C, resistors 10A and 10C are set to a low resistance (Rmin) while GMR resistors 10B and 10D are set to a high resistance (Rmin+delta R). This is because the magnetization polarization directions of their pinned and free ferromagnetic layers 15A and 15C, respectively, are parallel in GMR resistors 10A and 10C and anti-parallel in GMR resistors 10B and 10D. The magnetic field 43 in the closed magnetic loop is due to a current passing through coil 40 in a second write direction, as shown in FIG. 1C.

The crisscross write coil 40 is shown in FIG. 1A, FIG. 1C and FIG. 2. The crisscross write coil 40 is electrically isolated from the GMR resistors 10A to 10D by dielectric layers (not shown) between top and bottom coil trace layers and the GMR layer and dielectric fills between GMR resistors 10A to 10D. Cross connections between top and bottom coil traces are made with vias.

FIG. 2 shows the 2-2 cross-section view magnetic field vectors 60, 62, 64, and 66 located within GMR resistors 10A to 10D, as shown in FIG. 1. An "O" indicates a magnetic field vector out of the paper and an "X" indicates a magnetic field vector into the paper. The magnetic field vector ends 60, 62, 64, and 66 are produced by portions 70, 72, 74, 76, respectively, of crisscross coil 40. The magnetic field vectors 60, 62, 64, and 66 show parts of continuous magnetic field 42 generated within closed magnetic loop 10 by crisscross coil 40 when current passes through coil 40 as shown in FIG. 1.

The crisscross coil 40 produces magnetic field vectors 60, 62, 64 and 66, due to a current passing through crisscross coil 40, in a direction shown in FIG. 2 and in FIG. 1. Such a current writes a nonvolatile 1010 bit pattern into resistors 10A to 10D, respectively, wherein, a "0" represents a low resistance state and a "1" represents a high resistance state. A current traveling in a direction opposite to that shown in FIG. 2 and FIG. 1 is shown in FIG. 1C, and writes a nonvolatile 0101 bit pattern into resistors 10A to 10D, respectively.

While the present invention has been disclosed in connection with the preferred embodiment thereof it should be understood that there are other embodiments which fall within the spirit and scope of the invention as defined by the following claims.

What is claimed is:

1. A magnetoresistive bridge nonvolatile memory device, comprising:
   (a) a continuous folded closed magnetic loop, the continuous folded closed magnetic loop comprised of four generally semi-circular regions and four central parallel rectangular regions;
   (b) a giant magnetoresistive (GMR) resistor within each central parallel rectangular region; and
   (c) a metal electrode terminated magnetic shunt at each generally semicircular region the four metal electrode terminated magnetic shunts magnetically and electrically connected to the four central rectangular giant magnetoresistive (GMR) resistors in a bridge configuration.

2. Magnetoresistive bridge nonvolatile memory device, comprising:
   (a) a continuous folded closed four-sided double horseshoe-shaped magnetic loop, the continuous folded closed four-sided double horseshoe-shaped magnetic loop comprising of four generally semi-circular regions and four central parallel rectangular regions;
   (b) a giant magnetoresistive (GMR) resistor in each central parallel rectangular region;
   (c) a metal electrode terminated magnetic shunt at each generally semi-circular region; and located on a side of the continuous four-sided double horseshoe-shaped magnetic loop, two oppositely apposed metal electrodes at each two metal electrode terminated magnetic shunts being electrically connected to opposite ends of a giant magnetoresistive resistor; and
   (d) an electromagnetic coil crisscross wrapped around the continuous folded closed four-sided double horseshoe-shaped magnetic loop.

* * * * *